United States Patent
Shimizu (10) Patent No.: US 12,463,633 B2
(45) Date of Patent: Nov. 4, 2025

(54) CONTROL DEVICE, AND SWITCHING DEVICE

(71) Applicant: FUJI ELECTRIC CO., LTD., Kanagawa (JP)

(72) Inventor: Naoki Shimizu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 205 days.

(21) Appl. No.: 18/337,065

(22) Filed: Jun. 19, 2023

(65) Prior Publication Data
US 2023/0336170 A1    Oct. 19, 2023

Related U.S. Application Data

(63) Continuation of application No. PCT/JP2022/021431, filed on May 25, 2022.

(30) Foreign Application Priority Data

Jul. 12, 2021    (JP) .................................. 2021-115321

(51) Int. Cl.
*H03K 17/0812*    (2006.01)
*H02M 1/32*    (2007.01)
*H03K 19/0175*    (2006.01)

(52) U.S. Cl.
CPC ........ *H03K 17/08122* (2013.01); *H02M 1/32* (2013.01); *H03K 19/017509* (2013.01); *H03K 2217/0027* (2013.01)

(58) Field of Classification Search
None
See application file for complete search history.

(56) References Cited

U.S. PATENT DOCUMENTS 6,304,472 B1    10/2001    Nagasu
7,133,300 B1 *  11/2006    Yang .................. H02M 3/33507
                                                                          363/21.13
(Continued)

FOREIGN PATENT DOCUMENTS

JP    H0534029 Y2    8/1993
JP    H05267580 A    10/1993
(Continued)

OTHER PUBLICATIONS

International Search Report and (ISA/237) Written Opinion of the International Search Authority for International Patent Application No. PCT/JP2022/021431, mailed by the Japan Patent Office on Aug. 9, 2022.

(Continued)

*Primary Examiner* — Thomas J. Hiltunen (57) ABSTRACT

A control apparatus is provided, comprising a protecting unit configured to perform, in response to short circuit occurring in a main switching device, protection operation to restrict current flowing through the main switching device, and a protection operation control unit configured to cause the protecting unit to continue the protection operation until power supply to a driving control unit for performing drive control of the main switching device according to a drive signal stops, wherein the protection operation control unit has a first retaining unit configured to retain information indicating that the protection operation is to be performed until a first cancellation condition is satisfied including that the short circuit has been eliminated and that the power supply has stopped, when the short circuit has occurred.

18 Claims, 4 Drawing Sheets

(56) References Cited

U.S. PATENT DOCUMENTS

| | | | | |
|---|---|---|---|---|
| 7,443,641 | B2* | 10/2008 | Suzuki | H02M 3/156 |
| | | | | 361/18 |
| 8,779,929 | B2* | 7/2014 | Komatsu | H03K 17/0822 |
| | | | | 361/103 |
| 9,065,443 | B2* | 6/2015 | Shimano | H02M 1/32 |
| 9,184,743 | B2* | 11/2015 | Shimizu | H03K 17/082 |
| 9,768,763 | B2* | 9/2017 | Terasawa | H03K 17/0828 |
| 11,171,480 | B2* | 11/2021 | Saji | H02M 1/143 |
| 2010/0263644 | A1* | 10/2010 | Matsuda | F02P 9/005 |
| | | | | 123/625 |
| 2012/0146782 | A1 | 6/2012 | Komatsu | |
| 2015/0180227 | A1 | 6/2015 | Sekigawa | |
| 2018/0367023 | A1* | 12/2018 | Terashima | H02M 1/08 |
| 2023/0112315 | A1* | 4/2023 | Taoka | H03K 17/28 |
| | | | | 361/93.1 |
| 2023/0387904 | A1* | 11/2023 | Kurosawa | H03K 17/08128 |

FOREIGN PATENT DOCUMENTS

| | | |
|---|---|---|
| JP | H114150 A | 1/1999 |
| JP | 2000324846 A | 11/2000 |
| JP | 2003088093 A | 3/2003 |
| JP | 2007028733 A | 2/2007 |
| JP | 2011259233 A | 12/2011 |
| JP | 2012050163 A | 3/2012 |
| JP | 2012143125 A | 7/2012 |
| JP | 2013258858 A | 12/2013 |
| JP | 2014103820 A | 6/2014 |
| JP | 2020150660 A | 9/2020 |

OTHER PUBLICATIONS

Office Action issued for counterpart Japanese Application No. 2023-535166, transmitted from the Japanese Patent Office on Jul. 30, 2024 (drafted on Jul. 22, 2024).

* cited by examiner

CONTROL DEVICE, AND SWITCHING DEVICE

BACKGROUND

1. Technical Field

The present invention relates to a control apparatus and a switching apparatus.

2. Related Art

Conventionaly, when a short circuit occurred in the main switching device, a protection operation such as restricting the gate voltage of the main switching device is performed, and the protection operation is cancelled in response to the short circuit being eliminated (see patent document 1, 2, for example).

Patent Document 1: Japanese Patent Application Publication No. 2011-259233
Patent Document 2: Japanese Patent Application Publication No. H11-4150

However, when the protection operation is simply cancelled in response to the short circuit being eliminated, there is a risk of a short circuit occurring again and causing destructive failure of a device.

DESCRIPTION OF EXEMPLARY EMBODIMENTS

Hereinafter, the invention will be described through embodiments of the invention, but the following embodiments do not limit the invention according to claims. In addition, some combinations of features explained in the embodiments may be unnecessary for the solving means of the invention.

1. First Embodiment

[1.1. Switching Apparatus]

Figure 1:
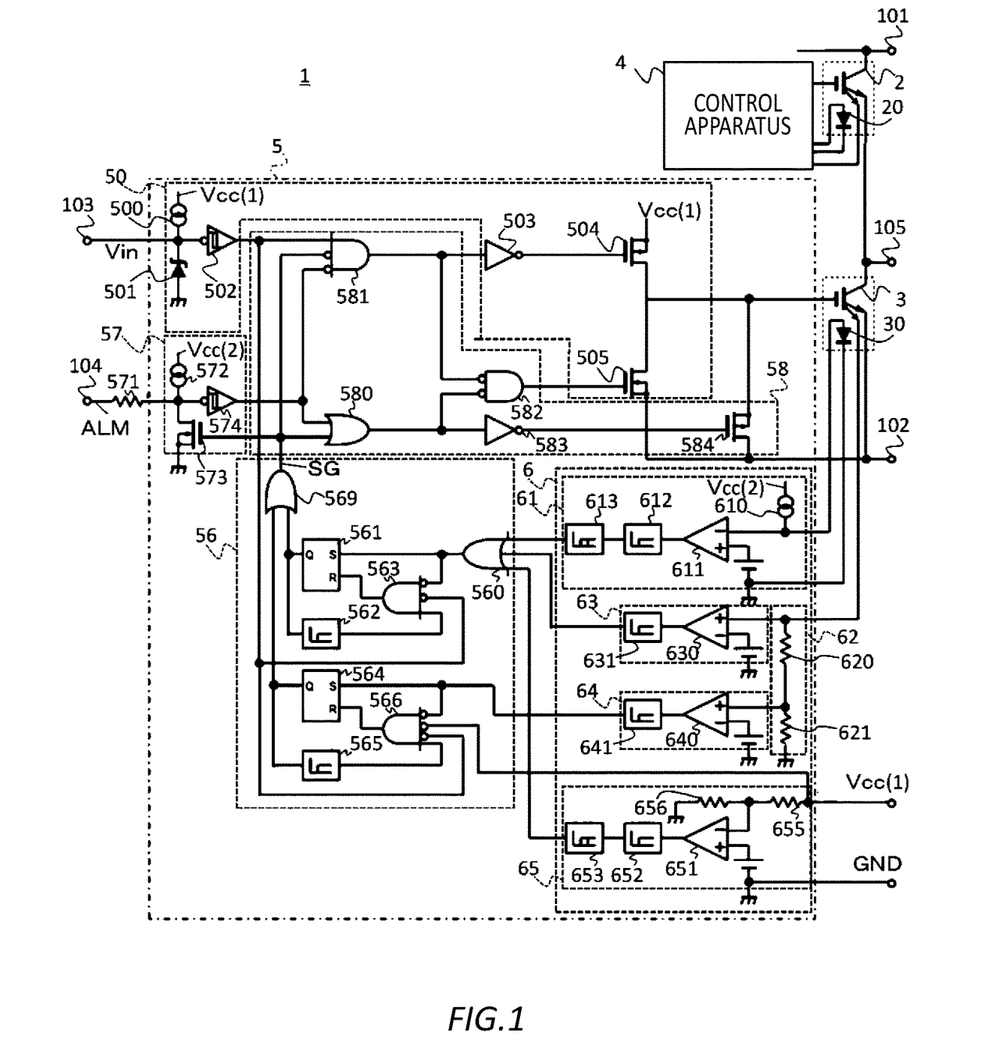
FIG. 1 illustrates a switching apparatus 1 according to a first embodiment.

FIG. 1 illustrates a switching apparatus 1 according to the present embodiment. The switching apparatus 1 may be an apparatus used for motor drive or power supply, and may be, for example, a power conversion apparatus such as an inverter apparatus configured to convert direct current power supplied from a positive terminal 101 and a negative terminal 102 into alternating current power to be output from a power supply output terminal 105. In addition, the switching apparatus 1 may be an intelligent power module (IPM) configured to automatically perform a protection operation when an abnormality occurs. The switching apparatus 1 may include main switching devices 2 and 3 on a positive side and a negative side, and control apparatuses 4 and 5 on the positive side and the negative side. It should be noted that, as an example, the negative terminal 102 may be connected to a ground. The switching apparatus 1 may be provided with an input terminal 103 to which a drive signal Vin is input, an alarm terminal 104 for outputting an alarm signal ALM, or the like, in addition to the positive terminal 101 and the negative terminal 102, and the power supply output terminal 105.

[1.1.1. Main Switching Devices 2 and 3]

The main switching devices 2 and 3 are sequentially connected in series between the positive terminal 101 and the negative terminal 102. For example, in each of the main switching devices 2 and 3, a collector terminal is connected on the positive terminal 101 side, and an emitter terminal is connected on the negative terminal 102 side. The main switching devices 2 and 3 may configure an upper arm and a lower arm in the switching apparatus, and the power supply output terminal 105 may be connected to a midpoint between the main switching device 2 and the main switching device 3.

The main switching devices 2, 3 may have a sense emitter terminal connected to corresponding control apparatuses 4, 5. In addition, a thermal diode 20, 30 for detecting overheat of the main switching devices 2, 3 may be arranged near the main switching devices 2, 3 (in the present embodiment, in the same chip as the main switching devices 2, 3, as an example), both the anode terminal and the cathode terminal of each of the thermal diodes 20, 30 may be connected to the control apparatuses 4, 5.

Note that, in the present embodiment, as an example, the main switching devices 2, 3 are IGBTs, and may have a parasitic diode (not illustrated) in which the positive terminal 101 side is the cathode. In addition to or instead of this, in each of the main switching devices 2 and 3, a freewheel diode (not illustrated) may be connected in anti parallel in such a way as to cause the positive terminal 101 side to serve as the cathode. The main switching devices 2 and 3 may also be a semiconductor device having other structures such as a MOSFET or a bipolar transistor.

[1.1.2. Control Apparatuses 4 and 5]

The control apparatuses 4 and 5 are configured to control the main switching devices 2 and 3. The control apparatus 4 on the positive side may set the main switching device 2 as the control target, and the control apparatus 5 on the negative side may set the main switching device 3 as the control target. It should be noted that since the control apparatuses 4 and 5 have a similar configuration, according to the present embodiment, the control apparatus 5 on the negative side will be described, and a description of the control apparatus 4 on the positive side will be omitted.

The control apparatus 5 is configured to control the main switching device 3. The control apparatus 5 has a driving control unit 50, an abnormality detection unit 6, a protection operation control unit 56, an alarm output unit 57, and a protecting unit 58. Note that, the driving control unit 50 and the protection operation control unit 56 may receive power supply from separate power sources. For example, among the components in the control apparatus 5, the driving control unit 50 and another component may receive power supply from separate power sources. In the present embodiment, as an example, the driving control unit 50 may receive power supply of a voltage (also referred to as a control voltage) Vcc (1) from one power source, and another component in the control apparatus 5 may receive power supply of a voltage (also referred to a control voltage) Vcc (2) from another power source. Note that, the voltage Vcc (1) and the voltage Vcc (2) may be the same voltage or may be a different voltage.

[1.1.2(1). Driving Control Unit 50]

The driving control unit 50 performs drive control of the main switching device 3 according to the drive signal Vin input to the input terminal 103. The drive signal Vin may be input from the outside, and may include signals for turning the main switching device 3 to an on-state and an off state. For example, the drive signal Vin may cause the main switching devices 2 and 3 to perform switching by a synchronous rectification method, and as an example, may be set in such a way as to cause the main switching devices 2 and 3 to be alternatively (in one example, alternately) put into a connected state across a deadtime in which both the main switching devices 2 and 3 are turned off. It should be noted that according to the present embodiment, as one example, the drive signal Vin instructs the main switching device 3 to be turned on in the case of a low level, and instructs the main switching device 3 to be turned off in the case of a high level.

The driving control unit 50 has a current source 500, a Zener diode 501, an inverted-type Schmitt trigger circuit 502, a NOT gate 503, a switching device 504, and a switching device 505.

The current source 500 maintains the potential of the input terminal 103 at a high level when the drive signal Vin for turning the main switching device 3 into the on-state has not been input to the input terminal 103. The Zener diode 501 is connected between the input terminal 103 and the ground with its cathode terminal facing the input terminal 103 side, and prevents overvoltage from being applied to the control apparatus 5 from the input terminal 103. The inverted-type Schmitt trigger circuit 502 is connected to the input terminal 103, and causes inversion of high level/low level of the drive signal Vin by having hysteresis. The inverted-type Schmitt trigger circuit 502 may supply the inverted drive signal Vin to the NOT gate 503 and the switching device 505 via the AND gates 581, 582 or the like in the protecting unit 58 described below.

The NOT gate 503 is provided between the AND gate 581 of the protecting unit 58 and the switching device 504. The NOT gate 503 may further cause inversion of the output signal from the AND gate 581 and supply the same to the switching device 504.

The switching device 504 is connected between the power source of the control voltage Vcc (1) and the gate of the main switching device 3. The switching device 504 is a switching device for turn-on, and turns the main switching device 3 on by allowing conduction between the power source of the control voltage Vcc (1) and the gate of the main switching device 3. The switching device 504 may be turned on when the signal supplied from the NOT gate 503 is at a low level. It should be noted that according to the present embodiment, as one example, the switching device 504 is a P type MOSFET, but may also be a semiconductor device having other structures.

The switching device 505 is connected between the gate of the main switching device 3 and the negative terminal 102. The switching device 505 is a switching device for turn-off, and turns the main switching device 3 off by allowing conduction between the gate of the main switching device 3 and the negative terminal 102. The switching device 505 may be turned on when the signal supplied from the AND gate 582 is at a high level. It should be noted that according to the present embodiment, as an example, the switching device 505 is an N type MOSFET, but may also be a semiconductor device having other structures.

[1.1.2 (2). Abnormality Detection Unit 6]

The abnormality detection unit 6 detects abnormality for which a protection operation is to be performed. In the present embodiment, as an example, the abnormality includes short circuit of the main switching device 3, overheat of the main switching device 3, overcurrent of the main switching device 3, and control voltage reduction. Overheat of the main switching device 3 may be that the main switching device 3 turns to a higher temperature than a reference temperature. Overcurrent of the main switching device 3 may be that a current greater than a reference current flows through the main switching device 3. Control voltage reduction may be that the supply voltage Vcc (1) by the power supply to the driving control unit 50 falls below a reference voltage. The abnormality detection unit 6 has an overheat detection unit 61, a measuring unit 62, an overcurrent detection unit 63, a short circuit detection unit 64, and a control voltage reduction detection unit 65.

[1.1.2 (2-1). Overheat Detection Unit 61]

The overheat detection unit 61 detects overheat of the main switching device 3. The overheat detection unit 61 has a current source 610, a comparator 611, a low-pass filter 612, and a hysteresis buffer 613.

The current source 610 is connected between the anode terminal of the thermal diode 30 and an inverting input terminal of the comparator 611, and causes a forward current to flow through the thermal diode 30. The forward voltage of the thermal diode 30 when the thermal diode 30 is at a higher temperature than the reference temperature may be lower than that when the thermal diode 30 is at the reference temperature. In this manner, when the main switching device 3 is an overheat state, a voltage lower than than when in a non-overheat state is applied to the inverting input terminal of the comparator 611. The non-inverting input terminal of the comparator 611 has a reference potential connected thereto. The reference potential of the comparator 611 may be equal to the potential of the inverting input terminal when the main switching device 3 is at the reference temperature. In this manner, the output signal of the comparator 611 is turned to a high level in response to the main switching device 3 being in an overheat state. The comparator 611 may supply the output signal to the protection operation control unit 56 via the low-pass filter 612 and the hysteresis buffer 613.

The low-pass filter 612 may remove a high frequency component included in the output signal from the comparator 611. The hysteresis buffer 613 may perform buffering on the output signal from the comparator 611 by having hysteresis to prevent flapping of the output signal.

[1.1.2 (2-2). Measuring Unit 62]

The measuring unit 62 measures a parameter according to a current flowing in the main switching device 3. The current that flows through the main switching device 3 may be instantaneous value of the current that flows through the switching device 3. In the present embodiment, as an example, the measuring unit 62 may have two resistors 620, 621 connected in series between the sense emitter terminal of the main switching device 3 and the ground. The measuring unit 62 may supply, to the overcurrent detection unit 63, the voltage detected in response to the sense emitter current flowing through both of the resistors 620, 621, and supply, to the short circuit detection unit 64, the voltage detected in response to the sense emitter current flowing through the resistor 621 on the ground side.

[1.1.2 (2-3). Overcurrent Detection Unit 63]

The overcurrent detection unit 63 detects overcurrent of the main switching device 3. The overcurrent detection unit 63 may detect that overcurrent has flown through the main switching device 3 according to the parameter measured by the measuring unit 62. Overcurrent may be a current that is greater than the reference current (as an example, rated current of the main switching device 3), or may be a current that is smaller than the current that flows when short circuit occurs in the main switching device 3. The overcurrent detection unit 63 has a comparator 630 and a low-pass filter 631.

A connection point between the resistor 620 of the measuring unit 62 and the sense emitter terminal of the main switching device 3 is connected to the non-inverting input terminal of the comparator 630, and a reference potential is connected to the inverting input terminal of the comparator 630. The reference potential of the comparator 630 may be equal to the potential of the non-inverting input terminal when the current flowing through the main switching device 3 is the reference current described above. In this manner, the output signal of the comparator 630 is turned to a high level in response to the main switching device 3 being in an overcurrent state. The comparator 630 may supply the output signal to the protection operation control unit 56 via the low-pass filter 631. The low-pass filter 631 may remove a high frequency component included in the output signal from the comparator 630.

[1.1.2 (2-4). Short Circuit Detection Unit 64]

The short circuit detection unit 64 detects short circuit of the main switching device 3. The short circuit detection unit 64 may detect that a short circuit has occurred in the main switching device 3 according to the parameter measured by the measuring unit 62. The short circuit detection unit 64 has a comparator 640 and a low-pass filter 641.

A connection point between the resistors 620, 621 of the measuring unit 62 is connected to the non-inverting input terminal of the comparator 640, and a reference potential is connected to the inverting input terminal of the comparator 640. The reference potential of the comparator 640 may be higher than a potential of the non-inverting input terminal when the main switching device 3 is not in a short circuit state, and may be lower than a potential of the non-inverting input terminal when the main switching device 3 is in a short circuit state. In this manner, the output signal of the comparator 640 is turned to a high level in response to the main switching device 3 being in a short circuit state. The comparator 640 may supply the output signal to the protection operation control unit 56 via the low-pass filter 641. The low-pass filter 641 may remove a high frequency component included in the output signal from the comparator 640.

[1.1.2 (2-5). Control Voltage Reduction Detection Unit 65]

The control voltage reduction detection unit 65 detects control voltage reduction. In the present embodiment, as an example, the control voltage reduction detection unit 65 may detect that the control voltage Vcc (1) has been reduced. The control voltage reduction detection unit 65 has resistors 655, 656, a comparator 651, a low-pass filter 652, and a hysteresis buffer 653.

The resistors 655, 656 are connected in series between the control voltage Vcc (1) and the ground. A connection point between the resistors 655, 656 may be connected to an inverting input terminal of the comparator 651, and a reference potential may be connected to a non-inverting input terminal of the comparator 651. The reference potential of the comparator 651 may be equal to the potential of the inverting input terminal when the control voltage Vcc (1) is at a reference voltage. The reference voltage may be, as an example, the minimal voltage of the control voltage Vcc (1) at which the driving control unit 50 operates normally. In this manner, the output signal of the comparator 651 is turned to a high level in response to the control voltage Vcc (1) falling below the reference voltage. The comparator 651 may supply the output signal to the protection operation control unit 56 via the low-pass filter 652 and the hysteresis buffer 653.

The low-pass filter 652 and the hysteresis buffer 653 may be similar to the low-pass filter 612 and the hysteresis buffer 613 of the overheat detection unit 61.

[1.1.2(3). Protection Operation Control Unit 56]

The protection operation control unit 56 causes the protecting unit 58 to perform a protection operation in response to any of the abnormality occurring, including short circuit of the main switching device 3, overheat of the main switching device 3, overcurrent of the main switching device 3 and control voltage reduction. The protection operation control unit 56 may cause the protection operation to be performed by turning a protection control signal SG supplied to the protecting unit 58 to a high level. The protection operation control unit 56 has an OR gate 560, a SR-type flip flop 561, a delay circuit 562, an AND gate 563, a SR-type flip flop 564, a delay circuit 565, an AND gate 566, and an OR gate 569.

[1.1.2 (3-1). OR Gate 560]

The OR gate 560 is connected to output terminals of the overheat detection unit 61, the overcurrent detection unit 63, and the control voltage reduction detection unit 65. The OR gate 560 may take logical disjunction of the output signals from the overheat detection unit 61, the overcurrent detection unit 63, and the control voltage reduction detection unit 65. The OR gate 560 may supply an operation result to the SR-type flip flop 561.

[1.1.2 (3-2). SR-Type Flip Flop 561]

The SR-type flip flop 561 is connected to the output terminal of the OR gate 560. The SR-type flip flop 561 is an example of the second retaining unit, which retains information indicating that a protection operation is to be performed until a second cancellation condition described below is satisfied, when at least one abnormality has occurred including overheat of the main switching device 3, overcurrent of the main switching device 3, or control voltage reduction. The SR-type flip flop 561 may retain information indicating that the protection operation is to be performed by being turned into a set state, and reset the information by being reset.

An output terminal of the OR gate 560 may be connected to a set terminal of the SR-type flip flop 561, and the SR-type flip flop 561 may be set in response to the signal from the OR gate 560 being at a high level. In this manner, the SR-type flip flop 561 is set by at least one abnormality occurring, including overheat of the main switching device 3, overcurrent of the main switching device 3, or control voltage reduction.

An output terminal of the AND gate 563 described below may be connected to a reset terminal of the SR-type flip flop 561, and the SR-type flip flop 561 may be reset in response to the output signal from the AND gate 563 being at a high level.

The SR-type flip flop 561 may output a signal at a high level in the set state, and output a signal at a low level in the reset state. The SR-type flip flop 561 may supply the output signal to the OR gate 569 and the delay circuit 562.

[1.1.2 (3-3). Delay Circuit 562]

The delay circuit 562 is connected to the output terminal of the SR-type flip flop 561. The delay circuit 562 may output a signal that is at a high level when a reference time or more has elapsed since a start of signal output at a high level by the SR-type flip flop 561. In the present embodiment, as an example, the delay circuit 562 may output a signal that turns into a high level when an output signal at a high level by the SR-type flip flop 561 is continued for a reference time or more, and takes a logical conjunction of the output signal of the SR-type flip flop 561 and a signal obtained by delaying the output signal of the SR-type flip flop 561 by the reference time. The delay circuit 562 may supply the output signal to the AND gate 563. The reference time may be any time set for the delay circuit 562. As an example, the reference time may be the minimal time for which the alarm output unit 57 is to output an alarm signal ALM.

[1.1.2 (3-4). AND gate 563] The AND gate 563 is provided between the OR gate 560, the delay circuit 562, and the inverted-type Schmitt trigger circuit 502, and the reset terminal of the SR-type flip flop 561. The AND gate 563 resets the SR-type flip flop 561 in response to the second cancellation condition having been satisfied.

The second cancellation condition includes that abnormality that occurred, among overheat of the main switching device 3, overcurrent of the main switching device 3, and control voltage reduction has been eliminated, that a drive signal Vin for turning the main switching device 3 into an on-state is not supplied, and that a reference time or more has elapsed since a start of the protection operation. Here, in the second cancellation condition, unlike the first cancellation condition described below, that power supply to the driving control unit 50 has stopped is not included in the condition. That the abnormality has been eliminated may be to be in a state where there is no abnormality. That a drive signal Vin for turning the main switching device 3 into an on-state is not supplied may be the supply of the drive signal Vin being stopped, or may by the drive signal Vin for turning the main switching device 3 into an off state being supplied.

In the present embodiment, as an example, the AND gate 563 may detect whether the second cancellation condition is satisfied by taking the logical conjunction of an inverted signal of the output signal from the OR gate 560 (in the present embodiment, as an example, logical disjunction of output signals from the overheat detection unit 61, the overcurrent detection unit 63, and the control voltage reduction detection unit 65), an inverted signal of the output signal from the inverted-type Schmitt trigger circuit 502 (in the present embodiment, as an example, an inverted drive signal Vin), and the output signal from the delay circuit 562. The AND gate 563 may supply the operation result to the reset terminal of the SR-type flip flop 561.

[1.1.2 (3-5). SR-Type Flip Flop 564]

The SR-type flip flop 564 is connected to an output terminal of the short circuit detection unit 64. The SR-type flip flop 564 is an example of the first retaining unit, which retains information indicating that a protection operation is to be performed until a first cancellation condition described below is satisfied when a short circuit has occurred. The SR-type flip flop 564 may retain information indicating that the protection operation is to be performed by being turned into a set state to be reset, thereby resetting the information.

An output terminal of the short circuit detection unit 64 may be connected to a set terminal of the SR-type flip flop 564, and the SR-type flip flop 564 may be set in response to the signal from the short circuit detection unit 64 being at a high level. In this manner, the SR-type flip flop 564 is set by a short circuit occurring in the main switching device 3.

An output terminal of the AND gate 566 described below may be connected to a reset terminal of the SR-type flip flop 564, and the SR-type flip flop 564 may be reset in response to the output signal from the AND gate 566 being at a high level.

The SR-type flip flop 564 may output a signal at a high level in the set state, and output a signal at a low level in the reset state. The SR-type flip flop 564 may supply the output signal to the OR gate 569 and the delay circuit 565.

[1.1.2 (3-6). Delay Circuit 565]

The delay circuit 565 is connected to an output terminal of the SR-type flip flop 564. The delay circuit 565 may output a signal that turns into a high level when a reference time or more has elapsed since a start of the signal output at a high level by the SR-type flip flop 564. In the present embodiment, as an example, the delay circuit 565 may output a signal that is turned to a high level when the output signal at a high level by the SR-type flip flop 564 is continued for a reference time or more, and takes the logical conjunction of the output signal of the SR-type flip flop 564 and a signal obtained by delaying the output signal of the SR-type flip flop 564 by the reference time. The delay circuit 565 may supply the output signal to the AND gate 566. The reference time may be any time set for the delay circuit 565. As an example, the reference time may be the minimal time for which the alarm output unit 57 is to output an alarm signal ALM.

[1.1.2 (3-7). AND Gate 566]

The AND gate 566 is provided between the short circuit detection unit 64, the control voltage reduction detection unit 65, the delay circuit 565, and the inverted-type Schmitt trigger circuit 502, and the reset terminal of the SR-type flip flop 564. The AND gate 566 is an example of the reset circuit, which resets the SR-type flip flop 564 in response to the first cancellation condition having been satisfied.

The first cancellation condition includes that the short circuit has been eliminated and that the power supply to the driving control unit 50 has been stopped. In this manner, when a short circuit occurs, a protection operation of the protecting unit 58 is continued until the power supply to the driving control unit 50 has stopped. That the short circuit has been eliminated may be to be in a state where there is no short circuit. That the power supply has stopped may be to be in a state where the power supply has stopped, or may be that the power supply has stopped temporarily. The first cancellation condition may further include that the drive signal Vin for turning the main switching device 3 into an on-state is not supplied and that a reference time or more has elapsed since the start of the protection operation.

In the present embodiment, as an example, the AND gate 566 may take the logical conjunction of an inverted signal of the output signal from the short circuit detection unit 64, an inverted signal of the voltage signal detected by the resistors 655, 656 of the control voltage reduction detection unit 65, an inverted signal of the output signal from the inverted-type Schmitt trigger circuit 502 (in the present embodiment, as an example, an inverted drive signal Vin), and the output signal of the delay circuit 565. Here, the voltage signal detected by the resistors 655, 656 of the control voltage reduction detection unit 65 may be at a high level as long as the power supply to the driving control unit 50 is not stopped, and may be at a low level when the power supply is stopped. The AND gate 566 may supply the operation result to the reset terminal of the SR-type flip flop 564.

[1.1.2 (3-8). OR gate 569] The OR gate 569 is connected to output terminals of the SR-type flip flops 561, 564. The OR gate 569 may take the logical disjunction of output signals of the SR-type flip flops 561, 564. The OR gate 569 may supply a signal of the operation result to the protecting unit 58 and the alarm output unit 57 as the protection control signal SG.

[1.1.2 (4). Alarm Output Unit 57]

The alarm output unit 57 is an example of the output unit, which outputs an alarm signal ALM from the alarm terminal 104 when the protection operation is to be performed. The alarm signal ALM may be at a high level when the protection operation is not being performed, and may provide an alert to an operator by turning to a low level when the protection operation is being performed. A resistor 571 may be connected to the alarm terminal 104. The alarm output unit 57 has a current source 572, a switching device 573, and an inverted-type Schmitt trigger circuit 574.

The current source 572 is connected to the alarm terminal 104, and maintains the alarm signal ALM output from the alarm terminal 104 at a high level by causing a current to flow outside from the alarm terminal 104 via the resistor 571. The switching device 573 is connected between the connection point between the current source 572 and the alarm terminal 104, and the ground. The switching device 573 is normally off, and is turned on in response to the protection control signal SG from the protection operation control unit 56 turning to a high level when the protection operation is to be performed, to cause a current from the current source 572 to the ground. In this manner, the alarm signal ALM output from the alarm terminal 104 is turned to a low level. The switching device 573 may be an N type MOSFET, as an example. The inverted-type Schmitt trigger circuit 574 is connected to the alarm terminal 104, and causes inversion of high level/low level of the alarm signal ALM by having hysteresis. The first threshold for when the alarm signal ALM is switched from the low level to the high level may be higher than the second threshold for when it is switched from the high level to the low level. In this manner, even when the protection control signal SG from the protection operation control unit 56 is switched from the high level to the low level, the output of the inverted-type Schmitt trigger circuit 574 is maintained at a high level until the alarm signal ALM exceeds the second threshold to be ensured to be at a high level. The inverted-type Schmitt trigger circuit 574 may supply the inverted alarm signal ALM to the protecting unit 58.

[1.1.2 (5). Protecting Unit 58]

The protecting unit 58 performs a protection operation for restricting a current that flows through the main switching device 3 in response to abnormality such as overheat, overcurrent, short circuit, control voltage reduction or the like being detected. The protecting unit 58 may perform the protection operation in response to the abnormality being detected by the overheat detection unit 61, the overcurrent detection unit 63, the short circuit detection unit 64, or the control voltage reduction detection unit 65. The protecting unit 58 has an OR gate 580, AND gates 581, 582, a NOT gate 583, and a switching device 584.

The OR gate 580 is connected to output terminals of the protection operation control unit 56 and the alarm output unit 57. The OR gate 580 may take the logical disjunction of the protection control signal SG from the protection operation control unit 56 and the inverted signal of the alarm signal ALM by the inverted-type Schmitt trigger circuit 574 of the alarm output unit 57. The OR gate 580 may supply the operation result to the AND gate 582 and the NOT gate 583.

The AND gate 581 is connected to the output terminals of the inverted-type Schmitt trigger circuit 502 of the driving control unit 50, the protection operation control unit 56, and the alarm output unit 57. The AND gate 581 may take the logical conjunction of the drive signal Vin inverted by the inverted-type Schmitt trigger circuit 502 of the driving control unit 50, a signal obtained by inverting the protection control signal SG from the protection operation control unit 56, and a signal obtained by further inverting the inverted signal of the alarm signal ALM by the inverted-type Schmitt trigger circuit 574 of the alarm output unit 57.

In this manner, when the protection operation is instructed to be performed by the protection control signal SG, and/or when an alert is provided by the alarm signal ALM, the output of the AND gate 581 will be at a low level regardless of the output signal of the inverted-type Schmitt trigger circuit 502, and in turn, the drive signal Vin. In addition, when the protection operation is not instructed to be performed by the protection control signal SG, and the alert is not provided by the alarm signal ALM, the output of the AND gate 581 coincides with the output of the inverted-type Schmitt trigger circuit 502.

The AND gate 581 may supply the output signal to the switching device 504 for turning the main switching device 3 on, via the NOT gate 503. In this manner, when the protection operation is instructed to be performed by the protection control signal SG, and/or when an alert is provided by the alarm signal ALM, the switching device 504 is maintained at an off state regardless of the drive signal Vin. In addition, when the protection operation is not instructed to be performed by the protection control signal SG, and when an alert is not provided by the alarm signal ALM, the switching device 504 is controlled according to to the drive signal Vin. The AND gate 581 may also supply the output signal to the AND gate 582.

The AND gate 582 is connected to output terminals of the AND gate 581 and the OR gate 580. The AND gate 582 may take the logical conjunction of an inverted signal o f the output signal of the AND gate 581 and an inverted signal of the output signal of the OR gate 580.

In this manner, when the protection operation is instructed to be performed by the protection control signal SG, and/or when an alert is provided by the alarm signal ALM, the output of the AND gate 582 will be at a low level regardless of the output signal of the AND gate 581, and in turn, the output signal of the inverted-type Schmitt trigger circuit 502 or the drive signal Vin. In addition, when the protection operation is not instructed to be performed by the protection control signal SG, and the alert is not provided by the alarm signal ALM, the output of the AND gate 582 coincides with the inverted signal of the output signal of the AND gate 581, and in turn, the inverted signal of an output of the inverted-type Schmitt trigger circuit 502 or the drive signal Vin.

The AND gate 582 may supply the output signal to the switching device 505 for turning the main switching device 3 off. In this manner, when the protection operation is instructed to be performed by the protection control signal SG, and/or when an alert is provided by the alarm signal ALM, the switching device 505 is maintained at an off state regardless of the drive signal Vin. In addition, when the protection operation is not instructed to be performed by the protection control signal SG, and when an alert is not provided by the alarm signal ALM, the switching device 505 is controlled according to to the drive signal Vin.

The NOT gate 583 is connected to an output terminal of the OR gate 580, and causes inversion of the output signal of the OR gate 580. The NOT gate 583 may supply the output signal to the switching device 584.

The switching device 584 is connected in parallel with the switching device 505 between a gate of the main switching device 3 and the negative terminal 102. The switching device 584 is a switching device for soft shutdown of the main switching device 3, and turns the main switching device 3 off by allowing conduction between the gate of the main switching device 3 and the negative terminal 102. A switching speed of the switching device 584 may be lower than a switching speed of the switching device 505. The switching device 505 may be turned on when the signal supplied from the NOT gate 583 is at a low level. It should be noted that according to the present embodiment, as one example, the switching device 505 is a P type MOSFET, but may also be a semiconductor device having other structures.

According to the switching apparatus 1 described above, the protection operation performed in response to occurrence of a short circuit is continued until power supply to the driving control unit 50 is stopped. Therefore, cancelling of the protection operation without removing the cause of the short circuit is prevented, and secondary disruption of devices due to cancellation of the protection operation can be prevented.

In addition, when a short circuit has occurred, information indicating that the protection operation is to be performed is retained in the SR-type flip flop 564 until the first cancellation condition including that the short circuit has been eliminated an that the power supply has stopped is satisfied. Therefore, it can be ensured that cancelling of the protection operation without removing the cause of the short circuit is prevented.

In addition, since the SR-type flip flop 564 is reset in response to the first cancellation condition having been satisfied, when the first cancellation condition is satisfied, protection operation can be cancelled to allow operation under normal condition to be resumed.

In addition, since the first cancellation condition further includes that the drive signal Vin for turning the main switching device 3 to an on-state is not supplied, the the protection operation can be cancelled with the main switching device 3 in an off state to allow the operation to be resumed. In addition, since the first cancellation condition includes that a reference time or more has elapsed since the start of the protection operation, short circuit can be prevented from repeatedly occurring within the reference time. In addition, since the protection operation will not be cancelled at least until the reference time has elapsed, the alarm signal ALM can be caused to be output continuously for the duration of the reference time.

In addition, information indicating that a protection operation is to be performed until a second cancellation condition is satisfied, when at least one abnormality has occurred including overheat of the main switching device 3, overcurrent of the main switching device 3, or control voltage reduction is retained in the SR-type flip flop 561. The second cancellation condition includes that the abnormality has been eliminated, that the drive signal Vin for turning the main switching device 3 into an on-state is not supplied, and that the reference time or more has elapsed since the start of the protection operation, and does not include that the power supply has been stopped as the condition. Therefore, for the protection operation due to overheat of the main switching device 3, overcurrent, or reduction of the control voltage Vcc (1), the protection operation can be quickly cancelled without requiring power supply to be stopped as a condition, and operation under normal condition can be resumed.

In addition, since the alarm signal ALM is output when the protection operation is performed, removal of the cause of the abnormality or stopping of the power supply can be facilitated by informing of the abnormality.

In addition, since the protection operation control unit 56 receives power supply from another power source that is different from that of the driving control unit 50, control can be continue even when power supply to the driving control unit 50 has stopped.

2. Second Embodiment

Figure 2:
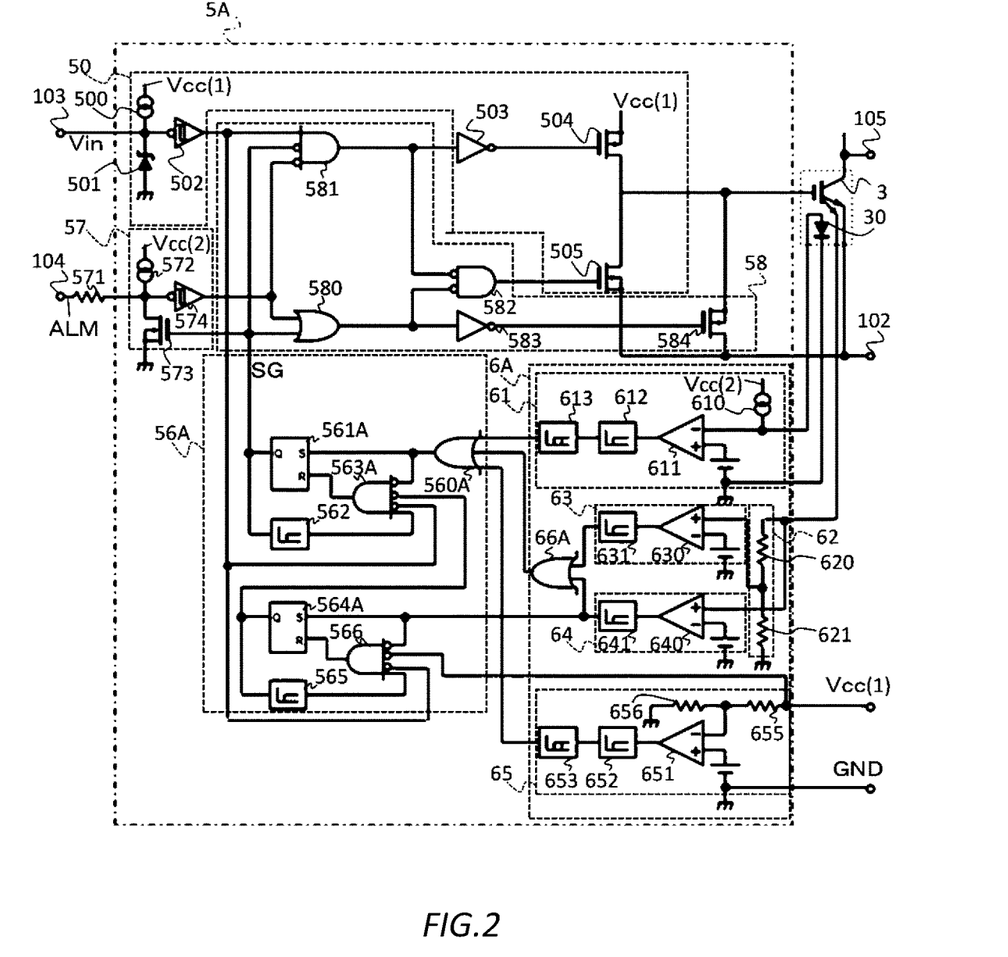
FIG. 2 illustrates a switching apparatus 1A according to a second embodiment.

FIG. 2 illustrates a switching apparatus 1A according to a second embodiment. A control apparatus 5A of the switching apparatus 1A includes an abnormality detection unit 6A and a protection operation control unit 56A. Note that, in FIG. 2 or FIGS. 3 and 4 described below, illustration of the main switching device 2 or the control apparatus thereof is omitted. In addition, in the present embodiment or other embodiments described below, those that are substantially the same as the switching apparatus 1 shown in FIG. 1 are illustrated with the same reference number, and descriptions thereof are omitted.

The abnormality detection unit 6A has an OR gate 66A connected to output terminals of an overcurrent detection unit 63 and a short circuit detection unit 64. The OR gate 66A may take the logical disjunction of output signals of the overcurrent detection unit 63 and the short circuit detection unit 64 and supply the operation result to the protection operation control unit 56A.

The protection operation control unit 56A may have an OR gate 560A, a SR-type flip flop 564A, an AND gate 563A, and a SR-type flip flop 561A.

The OR gate 560A is connected to output terminals of an overheat detection unit 61, an OR gate 66A, and a control voltage reduction detection unit 65. The OR gate 560A may take the logical disjunction of output signals from the overheat detection unit 61, the OR gate 66A, and the control voltage reduction detection unit 65. The OR gate 560A may supply the operation result to a set terminal of the SR-type flip flop 561A. In this manner, the SR-type flip flop 561A is set in response to the logical disjunction of output signals from the overheat detection unit 61, the overcurrent detection unit 63, the short circuit detection unit 64, and the control voltage reduction detection unit 65 being taken, causing any of the output signals turn to a high level.

The SR-type flip flop 564A is connected to output terminals of the short circuit detection unit 64 and the AND gate 566. Similar to the SR-type flip flop 564 in the first embodiment described above, the SR-type flip flop 564A may be set in response to a signal from the short circuit detection unit 64 turning to a high level, and reset in response to an output signal from the AND gate 566 turning to a high level. The SR-type flip flop 564A may supply, to the delay circuit 565 and the AND gate 563A, a signal at a high level in the set state, and a signal at a low level in the reset state.

The AND gate 563A is provided between the OR gate 560, the delay circuit 562, the inverted-type Schmitt trigger circuit 502, and the SR-type flip flop 564A, and a reset terminal of the SR-type flip flop 561A. The AND gate 563A resets the SR-type flip flop 561A in response to a third cancellation condition having been satisfied.

The third cancellation condition does not include that the power supply to the driving control unit 50 has been stopped as the condition, and includes, in addition to the second cancellation condition described above, that the output of the SR-type flip flop 564A is turned to a low level. In this manner, when no short circuit has occurred so far, since the output signal of the SR-type flip flop 564A is at a low level, the AND gate 563A resets the SR-type flip flop 561A in response to the rest of the conditions of the third cancellation condition, that is, the second cancellation condition, having been satisfied. On the other hand, once a short circuit has occurred, until the first cancellation condition is satisfied, since the output signal of the SR-type flip flop 564A is at a high level, the AND gate 563A does not perform reset of the SR-type flip flop 561A regardless of whether the rest of the conditions of the third cancellation condition, that is, the second cancellation condition, has been satisfied. Once the short circuit occurs and when the first cancellation condition has been satisfied, since the output signal of the SR-type flip flop 564A is at a low level, the AND gate 563A resets the SR-type flip flop 561A in response to the rest of the conditions of the third cancellation condition, that is, second cancellation condition, having been satisfied.

In the present embodiment, as an example, the AND gate 563A may detect whether the third cancellation condition has been satisfied by taking the logical conjunction of an inverted signal of the output signal from the OR gate 560A, an inverted signal of the output signal from the inverted-type Schmitt trigger circuit 502, the output signal from the delay circuit 562, and an inverted signal of the output signal of the SR-type flip flop 564A. The AND gate 563A may supply the operation result to the reset terminal of the SR-type flip flop 561A.

The SR-type flip flop 561A is connected to output terminals of the OR gate 560A and the AND gate 562A. Similar to the SR-type flip flop 561 in the first embodiment described above, the SR-type flip flop 561A may be set in response to a signal from the OR gate 560A turning to a high level, and reset in response to an output signal from the AND gate 566A turning to a high level. The SR-type flip flop 561A may supply, to the delay circuit 562 and the driving control unit 50, a signal at a high level in the set state and a signal at a low level in the reset state.

Also according to the switching apparatus 1A described above, an effect similar to that of the switching apparatus 1 in the first embodiment described above can be obtained.

3. Third Embodiment

Figure 3:
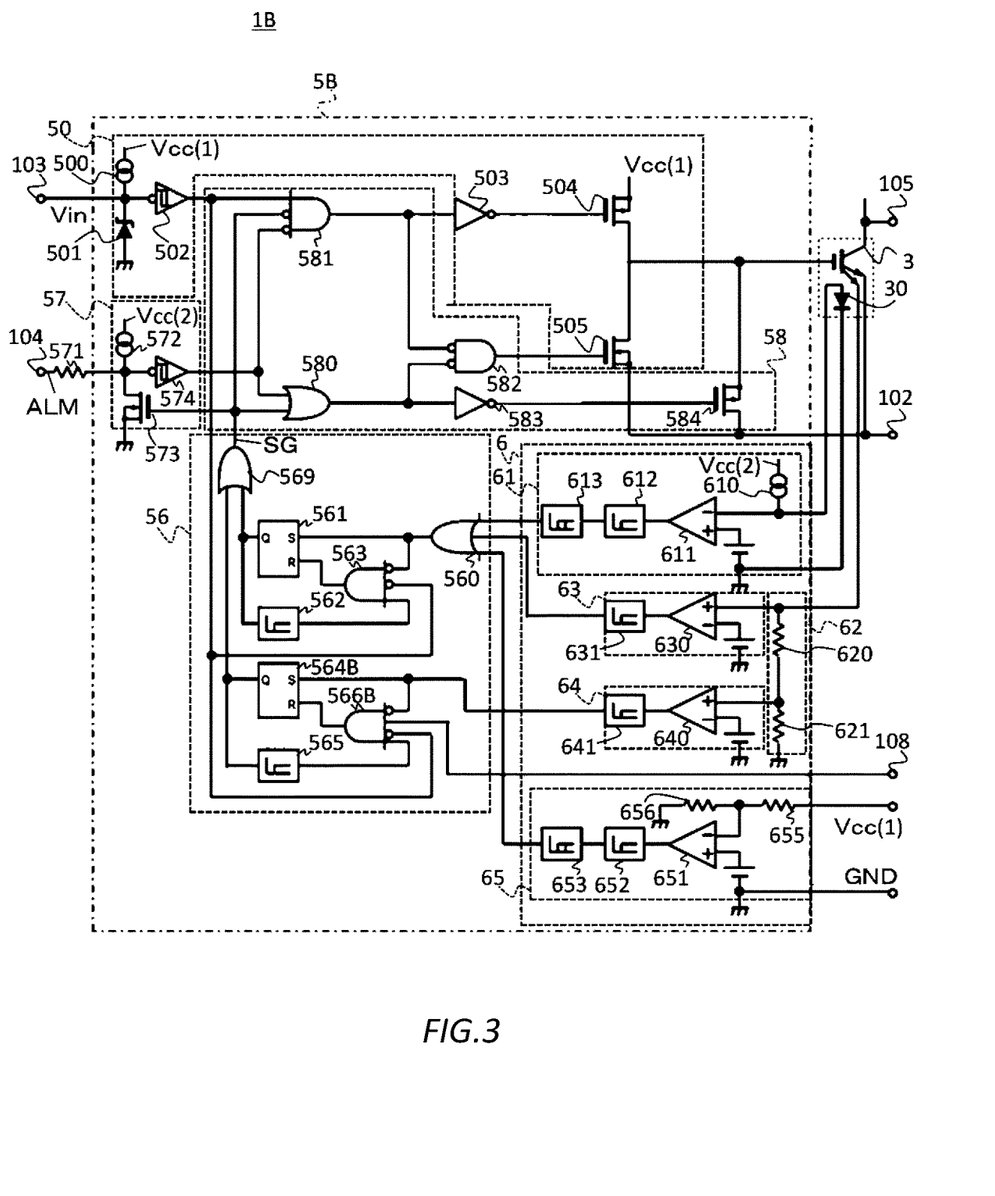
FIG. 3 illustrates a switching apparatus 1B according to a third embodiment.

FIG. 3 illustrates a switching apparatus 1B according to a third embodiment. The switching apparatus 1B includes a manipulation detection terminal 108 and a control apparatus 5B.

The manipulation detection terminal 108 detects an input of reference manipulation for when the power supply is to be resumed. The reference manipulation may be manipulation for instructing start of power supply to the driving control unit 50 (as an an example, manipulation on a power source button), manipulation for instructing initialization to be performed after activation of the switching apparatus 1B or the control apparatus 5B, or the like. When the reference manipulation is performed, a signal at a high level may be supplied from the manipulation detection terminal 108 to the control apparatus 5B.

The control apparatus 5B has a SR-type flip flop 564B and an AND gate 566B. The SR-type flip flop 564B is connected to an output terminal of the short circuit detection unit 64. The SR-type flip flop 564B retains information indicating that a protection operation is to be performed until the first cancellation condition according to the present embodiment is satisfied.

Here, the first cancellation condition in the present embodiment include that, when a short circuit has occurred, the short circuit has been eliminated and that the reference manipulation for when the power supply is to be resumed has been performed. In this way, when a short circuit has occurred, the protection operation of the protecting unit 58 is continued until the reference manipulation for when the power supply is to be resumed has been performed. The first cancellation condition may further include that the drive signal Vin for turning the main switching device 3 into an on-state is not supplied and that a reference time or more has elapsed since the start of the protection operation.

An output terminal of the AND gate 566B may be connected to a reset terminal of the SR-type flip flop 564B, and the SR-type flip flop 564B may be reset in response to the output signal from the AND gate 566B being at a high level. The SR-type flip flop 564B may supply the output signal to the delay circuit 565 and the OR gate 569.

The AND gate 566B is provided between the short circuit detection unit 64, the manipulation detection terminal 108, the delay circuit 565, and the inverted-type Schmitt trigger circuit 502, and the reset terminal of the SR-type flip flop 564B. The AND gate 566B resets the SR-type flip flop 564B in response to the first cancellation condition having been satisfied. In the present embodiment, as an example, the AND gate 566B may take the logical conjunction of an inverted signal of the output signal from the short circuit detection unit 64, the signal from the manipulation detection terminal 108, an inverted signal of the output signal from the inverted-type Schmitt trigger circuit 502 (in the present embodiment, as an example, an inverted drive signal Vin), and the output signal from the delay circuit 565. The AND gate 566B may supply the operation result to the reset terminal of the SR-type flip flop 564B.

According to the switching apparatus 1B described above, when a short circuit has occurred, information indicating that a protection operation is to be performed is retained in the SR-type flip flop 564B until a first cancellation condition including that the short circuit has been eliminated and that reference manipulation for when the power supply is to be resumed has been performed is satisfied. Therefore, it can be ensured that cancelling of the protection operation without removing the cause of the short circuit is prevented.

In addition, since the SR-type flip flop 564B is reset in response to the first cancellation condition having been satisfied, when the first cancellation condition is satisfied, protection operation can be cancelled to allow operation under normal condition to be resumed.

Note that, in the present embodiment, although it is described that the SR-type flip flop 564B supplies the output signal to the OR gate 569, it may supply the output signal to the AND gate 563, similarly to the SR-type flip flop 564A in the second embodiment.

4. Fourth Embodiment

Figure 4:
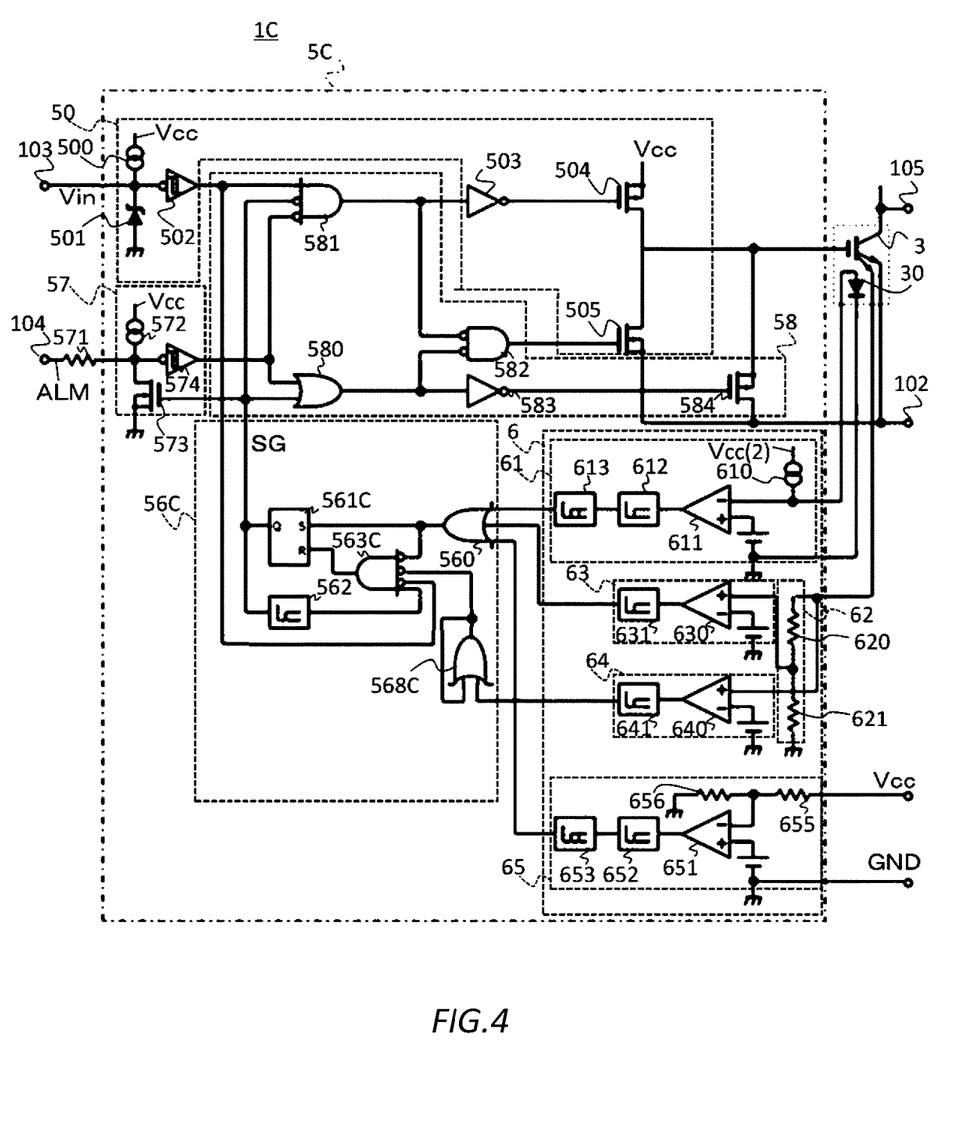
FIG. 4 illustrates a switching apparatus 1C according to a fourth embodiment.

FIG. 4 illustrates a switching apparatus 1C according to a fourth embodiment.

A protection operation control unit 56C of a control apparatus 5C in the switching apparatus 1C receives power supply from a common power source with the driving control unit 50. For example, each component in the control apparatus 5C may receive power supply of a voltage Vcc from the common power source. The protection operation control unit 56C has an OR gate 568C, a SR-type flip flop 561C, and a AND gate 563C.

The OR gate 568C is provided between the short circuit detection unit 64 and the AND gate 563C, and latches an output signal at a high level when a short circuit is detected by the short circuit detection unit 64. The OR gate 568C may take the logical disjunction of the output signal of the short circuit detection unit 64 and the output signal of the OR gate 568C itself. In this manner, once the output signal from the short circuit detection unit 64 turns to a high level, the output signal of the OR gate 568C is maintained at a high level. The OR gate 568C may supply the output signal to the AND gate 563C.

The SR-type flip flop 561C is connected to output terminals of the OR gate 560 and the AND gate 563C. The SR-type flip flop 561C is an example of the third retaining unit, which retains information on whether to continue the protection operation in response to the protection operation control unit 56C receiving power supply from the common power source with the driving control unit 50. The SR-type flip flop 561C may retain information indicating that the protection operation is to be performed by turning to a set state, and may reset the information by being reset.

Similar to the SR-type flip flop 561 in the first embodiment described above, the SR-type flip flop 561C may be set in response to a signal from the OR gate 560 turning to a high level, and reset in response to an output signal from the AND gate 563C turning to a high level. The SR-type flip flop 561C may supply the output signal to the AND gate 581, the OR gate 580 and the delay circuit 562.

The AND gate 563C is provided between the OR gate 560, the delay circuit 562, the inverted-type Schmitt trigger circuit 502, and the OR gate 568C, and a reset terminal of the SR-type flip flop 561C. The AND gate 563C resets the SR-type flip flop 561C in response to the fourth cancellation condition having been satisfied.

The fourth cancellation condition includes, in addition to the second cancellation condition described above, that the output of the OR gate 568C has turned to a low level. In this manner, when no short circuit has occurred so far, since the output signal of the OR gate 568C is at a low level, the AND gate 563C resets the SR-type flip flop 561C in response to the rest of the conditions of the fourth cancellation condition, that is, the second cancellation condition, having been satisfied. On the other hand, once a short circuit has occurred, since the output signal of the OR gate 568C is maintained at a high level, the AND gate 563C does not perform reset of the SR-type flip flop 561C regardless of whether the rest of the conditions of the fourth cancellation condition, that is, the second cancellation condition has been satisfied. Therefore, once the short circuit has occurred, the SR-type flip flop 561C is maintained to be in the set state as long as power supply is maintained, and is reset in response to the power supply being stopped.

In the present embodiment, as an example, the AND gate 563C may detect whether the fourth cancellation condition has been satisfied by taking the logical conjunction of an inverted signal of the output signal from the OR gate 560, an inverted signal of the output signal from the inverted-type Schmitt trigger circuit 502, the output signal from the delay circuit 562, and an inverted signal of the output signal from the OR gate 568C. The AND gate 563C may supply the operation result to the reset terminal of the SR-type flip flop 561C.

According to the switching apparatus 1C described above, information indicating whether the protection operation is to be continued is retained in the SR-type flip flop 561C in response to the protection operation control unit 56C receiving power supply from a common power source with the driving control unit 50. Therefore, it can be ensured that the protecting unit 58 is caused to continue the protection operation until power supply to the driving control unit 50 is stopped. In addition, since the information is reset when the power supply is stopped, the protection operation can be cancelled to resume operation in a normal condition.

5. Variation Example

Note that, in the embodiments described above, although it is described that the control apparatus 5 has the driving control unit 50 and the alarm output unit 57, it may not have at least one of these components. In addition, although it is described that the abnormality detection unit 6 has the overheat detection unit 61, the overcurrent detection unit 63, and the control voltage reduction detection unit 65, it may not have at least one of these components.

In addition, the description has been provided where the voltage detected in response to a state where the sense emitter current of the main switching device 3 flows in the resistors 620, 621 is used as the parameter according to the current flowing in the main switching device 3, but other parameters such as a voltage detected in response to a state where an emitter current of the main switching device 3 flows in the resistor may also be used.

In addition, although it is described that the protecting unit 58 performs soft shutdown of the main switching device 3 when an abnormality such as short circuit or overcurrent has occurred, it may reduce and maintain the gate voltage of the main switching device 3 to a reference voltage that is lower than the gate voltage in a steady on-state.

While the embodiments of the present invention have been explained, the technical scope of the present invention is not limited to the above-described embodiments. It is apparent to persons skilled in the art that various alterations or improvements can be added to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

EXPLANATION OF REFERENCES 1 switching apparatus,
2 main switching device,
3 main switching device,
4 control apparatus,
5 control apparatus,
6 abnormality detection unit,
20 thermal diode,
30 thermal diode,
50 driving control unit,
56 protection operation control unit,
57 alarm output unit,
58 protecting unit,
61 overheat detection unit,
62 measuring unit,
63 overcurrent detection unit,
64 short circuit detection unit,
65 control voltage reduction detection unit,
66 OR gate,
101 positive terminal,
102 negative terminal,
103 input terminal, 104 alarm terminal,
105 power supply output terminal,
108 manipulation detection terminal,
500 current source,
501 Zener diode,
502 inverted-type Schmitt trigger circuit,
503 NOT gate,
504 switching device,
505 switching device,
560 OR gate,
561 SR-type flip flop,
562 delay circuit,
563 AND gate,
564 SR-type flip flop,
565 delay circuit,
566 AND gate,
568 OR gate,
569 OR gate,
571 resistor,
572 current source,
573 switching device,
574 inverted-type Schmitt trigger circuit,
580 OR gate,
581 AND gate,
582 AND gate,
583 NOT gate,
584 switching device,
610 current source,
611 comparator,
612 low-pass filter,
613 hysteresis buffer,
620 resistor,
621 resistor,
630 comparator,
631 low-pass filter,
640 comparator,
641 low-pass filter,
651 comparator,
652 low-pass filter,
653 hysteresis buffer,
655 resistor.

What is claimed is:

1. A control apparatus comprising:
a protecting unit configured to perform, in response to short circuit occurring in a main switching device, protection operation to restrict current flowing through the main switching device;
a protection operation control unit configured to cause the protecting unit to continue the protection operation until power supply to a driving control unit for performing drive control of the main switching device according to a drive signal stops;
a measuring unit configured to measure a parameter corresponding to a current flowing through the main switching device; and
a detection unit configured to detect that a short circuit has occurred in the main switching device according to the parameter measured by the measuring unit.

2. The control apparatus according to claim 1, wherein
the protection operation control unit has a first retaining unit configured to retain information indicating that the protection operation is to be performed until a first cancellation condition is satisfied including that the short circuit has been eliminated and that the power supply has stopped, when the short circuit has occurred.

3. The control apparatus according to claim 1, wherein
the protection operation control unit has a first retaining unit configured to retain information indicating that the protection operation is to be performed until a first cancellation condition is satisfied including that the short circuit has been eliminated and a reference manipulation for when the power supply is to be resumed has been performed, when the short circuit has occurred.

4. The control apparatus according to claim 2, wherein
the protection operation control unit has a reset circuit configured to reset the first retaining unit in response to the first cancellation condition having been satisfied.

5. The control apparatus according to claim 3, wherein
the protection operation control unit has a reset circuit configured to reset the first retaining unit in response to the first cancellation condition having been satisfied.

6. The control apparatus according to claim 2, wherein the first cancellation condition further includes that the drive signal for turning the main switching device to an on-state has not been supplied and that a reference time or more has elapsed since a start of the protection operation.

7. The control apparatus according to claim 3, wherein the first cancellation condition further includes that the drive signal for turning the main switching device to an on-state has not been supplied and that a reference time or more has elapsed since a start of the protection operation.

8. The control apparatus according to claim 4, wherein the first cancellation condition further includes that the drive signal for turning the main switching device to an on-state has not been supplied and that a reference time or more has elapsed since a start of the protection operation.

9. The control apparatus according to claim 2, wherein
the protecting unit is configured to perform the protection operation in response to at least one abnormality occurring, including the main switching device turning to a higher temperature than a reference temperature, a current that is greater than a reference current flowing through the main switching device, or a supply voltage by the power supply falling below a reference voltage, and
the protection operation control unit has a second retaining unit configured to retain information indicating that the protection operation is to be performed until a second cancellation condition is satisfied which includes that the abnormality that has occurred has been eliminated, the drive signal for turning the main switching device to an on-state has not been supplied, and that a reference time or more has elapsed since a start of the protection operation, the second cancellation condition not including a condition that the power supply has been stopped, when the at least one abnormality has occurred.

10. The control apparatus according to claim 3, wherein
the protecting unit is configured to perform the protection operation in response to at least one abnormality occurring, including the main switching device turning to a higher temperature than a reference temperature, a current that is greater than a reference current flowing through the main switching device, or a supply voltage by the power supply falling below a reference voltage, and
the protection operation control unit has a second retaining unit configured to retain information indicating that the protection operation is to be performed until a second cancellation condition is satisfied which includes that the abnormality that has occurred has been eliminated, the drive signal for turning the main switching device to an on-state has not been supplied, and that a reference time or more has elapsed since a start of the protection operation, the second cancellation condition not including a condition that the power supply has been stopped, when the at last one abnormality has occurred.

11. The control apparatus according to claim 2, wherein the protection operation control unit receives power supply from another power source that is different from that of the driving control unit.

12. The control apparatus according to claim 3, wherein the protection operation control unit receives power supply from another power source that is different from that of the driving control unit.

13. The control apparatus according to claim 1, wherein the protection operation control unit has a second retaining unit configured to retain information indicating whether to continue the protection operation, in response to receiving power supply from a power source that is common with the driving control unit.

14. The control apparatus according to claim 1, further comprising an output unit configured to output an alarm signal when the protection operation is to be performed.

15. The control apparatus according to claim 2, further comprising an output unit configured to output an alarm signal when the protection operation is to be performed.

16. The control apparatus according to claim 1, further comprising the driving control unit.

17. The control apparatus according to claim 2, further comprising the driving control unit.

18. A switching apparatus comprising the control apparatus according to claim 16 and the main switching device.

* * * * *